(12) United States Patent
Fan et al.

(10) Patent No.: US 9,412,438 B2
(45) Date of Patent: Aug. 9, 2016

(54) WRITING DATA TO A MEMORY CELL

(71) Applicant: TAIWAN SEMICONDUCTOR MANUFACTURING COMPANY, LTD., Hsinchu (TW)

(72) Inventors: Kai Fan, Los Altos, CA (US); Kuoyuan (Peter) Hsu, San Jose, CA (US); Bing Wang, Palo Alto, CA (US); Sung-Chieh Lin, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 45 days.

(21) Appl. No.: 14/163,025

(22) Filed: Jan. 24, 2014

(65) Prior Publication Data
US 2015/0213880 A1    Jul. 30, 2015

(51) Int. Cl.
*G11C 11/00* (2006.01)
*G11C 11/419* (2006.01)

(52) U.S. Cl.
CPC .................................. *G11C 11/419* (2013.01)

(58) Field of Classification Search
CPC ...................................................... G11C 11/419
USPC .................................................. 365/154, 149
See application file for complete search history.

(56) References Cited

U.S. PATENT DOCUMENTS

| | | | | |
|---|---|---|---|---|
| 7,486,540 | B2 * | 2/2009 | Gouin et al. | 365/154 |
| 7,701,783 | B2 * | 4/2010 | Yamagami | 365/189.06 |
| 8,120,975 | B2 * | 2/2012 | Kenkare et al. | 365/189.16 |
| 8,233,342 | B2 * | 7/2012 | Adams et al. | 365/203 |
| 8,331,132 | B2 * | 12/2012 | Cheng et al. | 365/149 |
| 8,625,334 | B2 * | 1/2014 | Liaw | 365/154 |
| 8,934,313 | B2 * | 1/2015 | Song et al. | 365/203 |
| 8,971,095 | B2 * | 3/2015 | Hsu | 365/154 |
| 8,995,176 | B2 * | 3/2015 | Liaw | 365/154 |
| 2005/0237848 | A1 * | 10/2005 | Takahashi et al. | 365/232 |
| 2014/0112062 | A1 * | 4/2014 | Trivedi et al. | 365/154 |
| 2015/0170734 | A1 * | 6/2015 | Hwang et al. | G11C 11/412 |
| 2015/0170737 | A1 * | 6/2015 | Wang et al. | G11C 11/419 |

* cited by examiner

*Primary Examiner* — Viet Q Nguyen
(74) *Attorney, Agent, or Firm* — Hauptman Ham, LLP

(57) ABSTRACT

A circuit comprises a first transistor, a capacitive component, a second transistor, and a data line. The first transistor has a threshold voltage value. A first terminal of the first transistor is coupled with a first terminal of the capacitive component and a second terminal of the second transistor. A second terminal of the first transistor is configured to receive a second-terminal voltage value. A third terminal of the first transistor is configured to receive a third-terminal voltage value. A first terminal of the second transistor is coupled with the data line. A third terminal of the second transistor is configured to receive a second-transistor control signal. The first transistor is configured to be on and off to maintain the data line at a data line voltage value.

20 Claims, 4 Drawing Sheets

WRITING DATA TO A MEMORY CELL

FIELD

The present disclosure is related to writing data to a memory cell.

BACKGROUND

For illustration, a static random access memory (SRAM) cell includes a pair of bit lines BL and BLB. A low and a high logical value are applied to corresponding bit lines BL and BLB to be written to the memory cell. In various situations, a negative bit line technique is used. For example, a negative voltage value such as a voltage value lower than a value of reference supply voltage VSS is applied to bit line BL. In some conditions, when an absolute value of the voltage on bit line BL increases beyond a certain value, a transistor used to generate the negative voltage for bit line BL breaks down.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
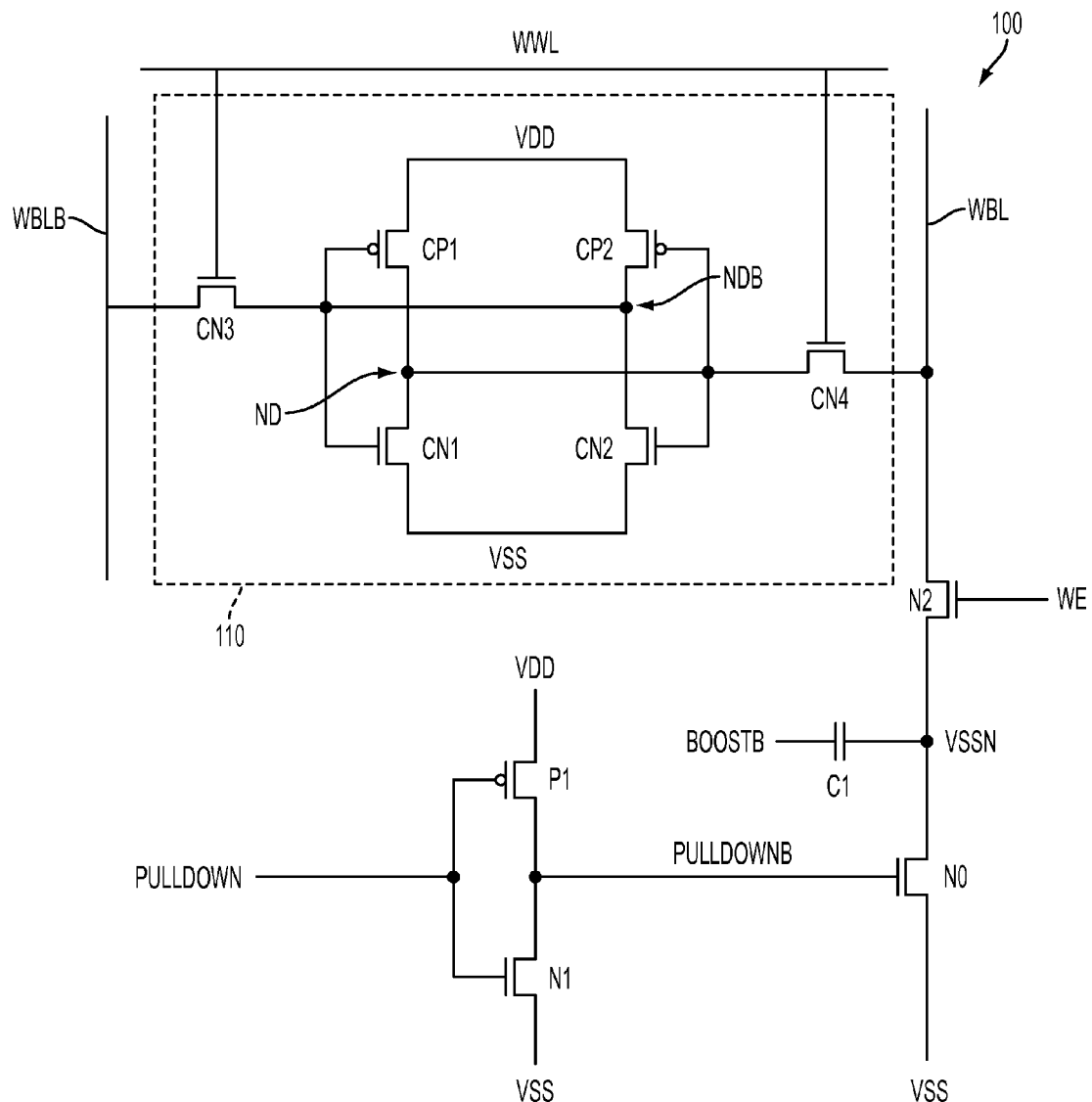
FIG. 1 is a diagram of a circuit that generates a negative voltage value on a write bit line, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A voltage value on a write bit line is clamped at about a predetermined voltage value. In some embodiments, the predetermined voltage value is based on a threshold voltage of a transistor coupled to the write bit line.

In this document, for simplicity, each of a drain terminal, a source terminal, or a gate terminal of a transistor is called a drain, a source, or a gate, respectively. A drain of a transistor becomes a source of the same transistor, and vice versa, depending on the voltage at the gate and at the drain or at the source of the same transistor as explained below.

Circuit

FIG. 1 is a diagram of a circuit 100, in accordance with some embodiments. Circuit 100 generates a negative voltage value on write bit line WBL of memory cell 110. Operations of circuit 100 are explained with reference to FIG. 2.

For illustration, the following nodes N.VSS, N.VSSN, N.BOOSTB, N.PULLDOWN, and N.PULLDOWNB are not labeled, and have corresponding voltages VSS, VSSN, BOOSTN, PULLDOWN, and PULLDOWNB. Voltages VG_N0, VD_N0, and VS_N0 are voltages at the gate, the drain, and the source of transistor N0, respectively. Voltage VGS_N0 is the voltage dropped across the gate and the source of transistor N0. Voltage Vth_N0 is the threshold voltage of transistor N0. Voltages VG_N1, VD_N1, and VS_N1 are voltages at the gate, the drain, and the source of transistor N1, respectively.

Memory cell 110 includes two P-type metal oxide semiconductor (PMOS) transistors CP1 and CP2, and four N-type metal oxide semiconductor (NMOS) transistors CN1, CN2, CN3, and CN4. Transistors CP1, CP2, CN1, and CN2 form a cross latch or cross-coupled inverters. Transistors CP1 and CN1 form a first inverter of the cross-coupled inverters while transistors CP2 and CN2 form a second inverter of the cross-coupled inverters. Drains of transistors CP1 and CN1 are coupled together and form a node ND. Drains of transistors CP2 and CN2 are coupled together and form a node NDB. Gates of transistors CP1 and CN1 are coupled together and to drains of transistors CP2 and CN2. Gates of transistors CP2 and CN2 are coupled together and to drains of transistors CP1 and CN1.

A write word line WWL is coupled with a gate of each of transistors CN3 and CN4 of a plurality of memory cells 110 in a row of memory cells. Write word line WWL is also called a write control line because the signal on write word line WWL controls transistors CN3 and CN4 for data on write bit lines WBL and WBLB to be written to corresponding nodes ND and NDB.

Each of transistor CN3 or transistor CN4 is called a pass gate or a pass gate transistor. Drains of transistors CN3 and CN4 are coupled to the pair of write bit lines WBL and WBLB, respectively. Write bit lines WBL and WBLB are coupled to each drain of transistors CN3 and CN4 of a plurality of memory cells 110 in a column of a memory array. Each of write bit lines WBL and WBLB is also called a write data line because the data carried on write bit lines WBL and WBLB is written to corresponding nodes ND and NDB.

In a write operation of memory cell 110, data to be written to memory cell 110 is applied to write bit lines WBL and WBLB. Write word line WWL is then activated to turn on transistors CN3 and CN4. As a result, the data on bit lines WBL and WBLB is transferred to and is stored in corresponding nodes ND and NDB.

For illustration, a low and a high logical value are written to nodes ND and NDB, respectively. As a result, a corresponding low and a high logical value are applied to write bit lines WBL and WBLB to be transferred to corresponding nodes ND and NDB. In some embodiments, both write bit lines WBL and WBLB are pre-charged to a high logical value. Pre-charge refers to charging to a high logical value before writing. Write bit line WBL is then pulled to ground or reference supply voltage VSS to have a low logical value. In various embodiments, write bit line WBL is pulled to a voltage lower than voltage VSS so that, at the time the data on write bit line WBL is transferred to node ND, write bit line WBL has a negative voltage value. Causing a voltage on write bit line WBL to change from 0 V to a negative voltage is called negative boosting.

Transistor N2 electrically connects and disconnects write bit line WBL to and from node N.VSSN. Effectively, transistor N2 also electrically connects and disconnects write bit line WBL to and from reference supply voltage VSS at the source of transistor N0. The drain of transistor N2 is coupled to write bit line WBL. The source of transistor N2 is coupled to node N.VSSN. The gate of transistor N2 receives a signal WE to turn on and off transistor N2. In some embodiments, transistor N2 is not used, and write bit line WBL is directly coupled no node N.VSSN.

When write bit line WBL is directly coupled to node N.VSSN or electrically coupled to node N.VSS through transistor N2, capacitor C1, together with transistor N0, pulls write bit line WBL to a voltage value lower than supply voltage VSS at the source of transistor N0. In embodiments where reference supply voltage VSS is 0V or ground, capacitor C1 pulls write bit line WBL to a negative voltage. A first terminal of capacitor C1 is coupled with node N.VSSN. A second terminal of capacitor C1 receives voltage BOOSTB.

An inverter formed by PMOS transistor P1 and NMOS transistor N1 provides a voltage PULLDOWNB at the inverter output that is coupled to the gate of transistor N0. The sources of transistor P1 and N1 receive voltages VDD and VSS, respectively. The drain of transistor N0 is coupled with node N.VSSN. The source of transistor N0 is coupled with node N.VSS. Voltage PULLDOWNB turns on and off transistor N0.

In some embodiments, when voltage PULLDOWN is logically high, voltage PULLDOWNB at the gate of transistor N0 has voltage VSS value at the source of transistor N1, and is therefore logically low. When voltage VSSN of node N.VSSN is lower than VSS-Vth_N0, node N.VSSN becomes the source of transistor N0, and node N.VSS becomes the drain of transistor N0. Further, transistor N0 is turned on and pulls node N.VSSN towards a voltage level of VSS at the source, now the drain, of transistor N0. When voltage VSSN of node N.VSSN is higher than VSS-Vth_N0, the drain and the source of transistor N0 switch and transistor N0 is turned off. Effectively, transistor N0 is continually turned on and off, causing node N.VSSN to be clamped at a voltage value of about VSS-Vth_N0. In other words, node N.VSSN is clamped at about voltage value VG_N0-Vth_N0.

Method

Figure 2:
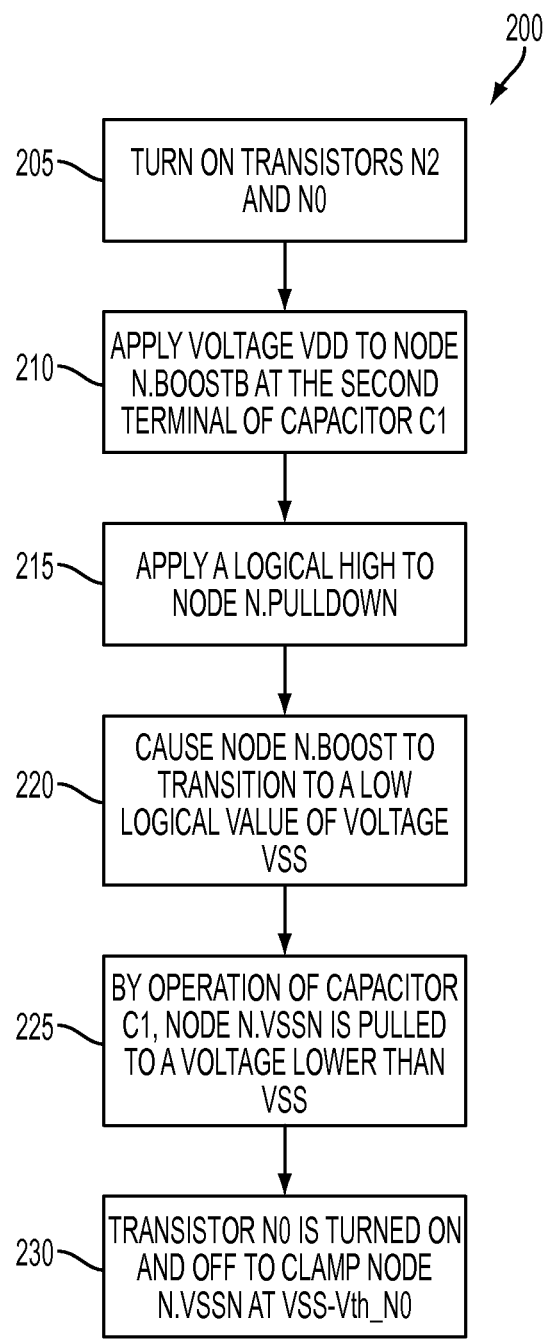
FIG. 2 is a flowchart of a method illustrating operations of the circuit in FIG. 1, in accordance with some embodiments.

FIG. 2 is a flowchart of a method 200, in accordance with some embodiments. Method 200 is used to illustrate operations of circuit 100 in FIG. 1.

In operation 205, transistor N2 is turned on to electrically couple write bit line WBL to node N.VSSN. Transistor N0 is also turned on to electrically couple node N.VSSN to node N.VSS at the source of transistor N0.

In operation 210, node N.BOOSTB is applied with a high logical value, at supply voltage VDD value, for example.

In operation 215, node N.PULLDOWN is applied with a high logical value to result in node N.PULLDOWNB having a low logical value of voltage VSS at the source of transistor N1. Because node N.PULLDOWNB is logically low, transistor N0 is turned off and electrically disconnects node N.VSSN from node N.VSS.

In operation 220, node N.BOOSTB is caused to transition from a high to a low logical value at a value of reference supply voltage VSS.

In operation 225, because node N.VSSN is logically low at voltage V.VSS and node N.BOOSTB transitions from a high to a low logical value, by operation of capacitor C1, node N.VSSN is pulled to a voltage lower than voltage VSS.

In operation 230, voltage VSSN of node N.VSSN reaches about a voltage VSS-Vth_N0. Node N.VSSN therefore becomes the source of transistor N0 and node N.VSS becomes the drain of transistor N0. Stated differently, because voltage VG_N0 at the gate of transistor N0 is at voltage VSS value, voltage VGS_N0 drop across the gate and the source of transistor N0 is greater than threshold voltage Vth_N0. As a result, transistor N0 is turned on and electrically couples node N.VSSN to node N.VSS. Voltage VSSN at node N.VSSN then starts to increase towards the voltage value of node N.VSS. When voltage VGS_N0 is less than threshold Vth_N0, transistor N0 is turn off, the drain and the source of transistor N0 switch again. Effectively, transistor N0 is continually turned on and off and causes node N.VSSN to be clamped at voltage VSS-Vth_N0.

Various embodiments of the disclosure are advantageous over other approaches because node N.VSSN and thus write bit line WBL are clamped at voltage VG_N0-Vth_N0. As a result, transistor N2 is not damaged as in some other approaches. For example, in some other approaches, the source of transistor N1 is coupled to node N.VSSN, instead of node N.VSS as in various embodiments of the present disclosure. Consequently, in the other approaches, when node N.PULLDOWN is logically high and transistor N1 is turned on, the voltage level at node N.PULLDOWNB is logically low at the voltage level of node N.VSSN at the source of transistor N1. Effectively, voltage VGS_N0 drop across the gate and the source of transistor N0 in the other approaches is VSSN-VSSN or 0V, and transistor N0 is off, regardless of the change of voltage VSSN at node N.VSSN. As a result, when the absolute value of voltage VSSN at node N.VSSN or the source of transistor N2 increases beyond a certain value, transistor N2 is damaged.

In the above illustration, the source of transistor N1 being at reference supply voltage value VSS is for illustration. The source of transistor N1 being coupled to another supply voltage source that provides various different voltage values are within the scope of various embodiments. In some embodiments, when transistor N1 is turned on to negatively boost node N.VSSN, node N.PULLDOWNB is also at a voltage value of the source of transistor N1 or at voltage VS_N1. Consequently, node N.VSSN is clamped at VS_N1-Vth_N0.

Transistors P1, N1 and the voltage value of node N.PULLDOWN used to provide voltage VSS to node N.PULLDOWNB at the gate of transistor N0 are for illustration. Other mechanisms to provide a voltage value to the gate of transistor N0 are within the scope of various embodiments. For example, in some embodiments, transistors P1 and N1 are not used, and a voltage source is coupled to node N.PULLDOWNB at the gate of transistor N0 to provide various different voltage values. As a result, when node N.VSSN is negatively boost, node N.VSSN is clamped at VG_N0-Vth_N0. For illustration, voltage Vtarget (not label) is a negative voltage value predetermined for write word line WBL for a specified write condition. Alternatively stated, write word line WBL is clamped at a predetermined value Vtarget to satisfy a specified write condition. In some embodiments, by operations of capacitor C1 and transistor N0, the following conditions are met:

VS_N0>Vtarget and

VG_N0>=Vtarget+Vth_N0

EMBODIMENTS

Figure 3:
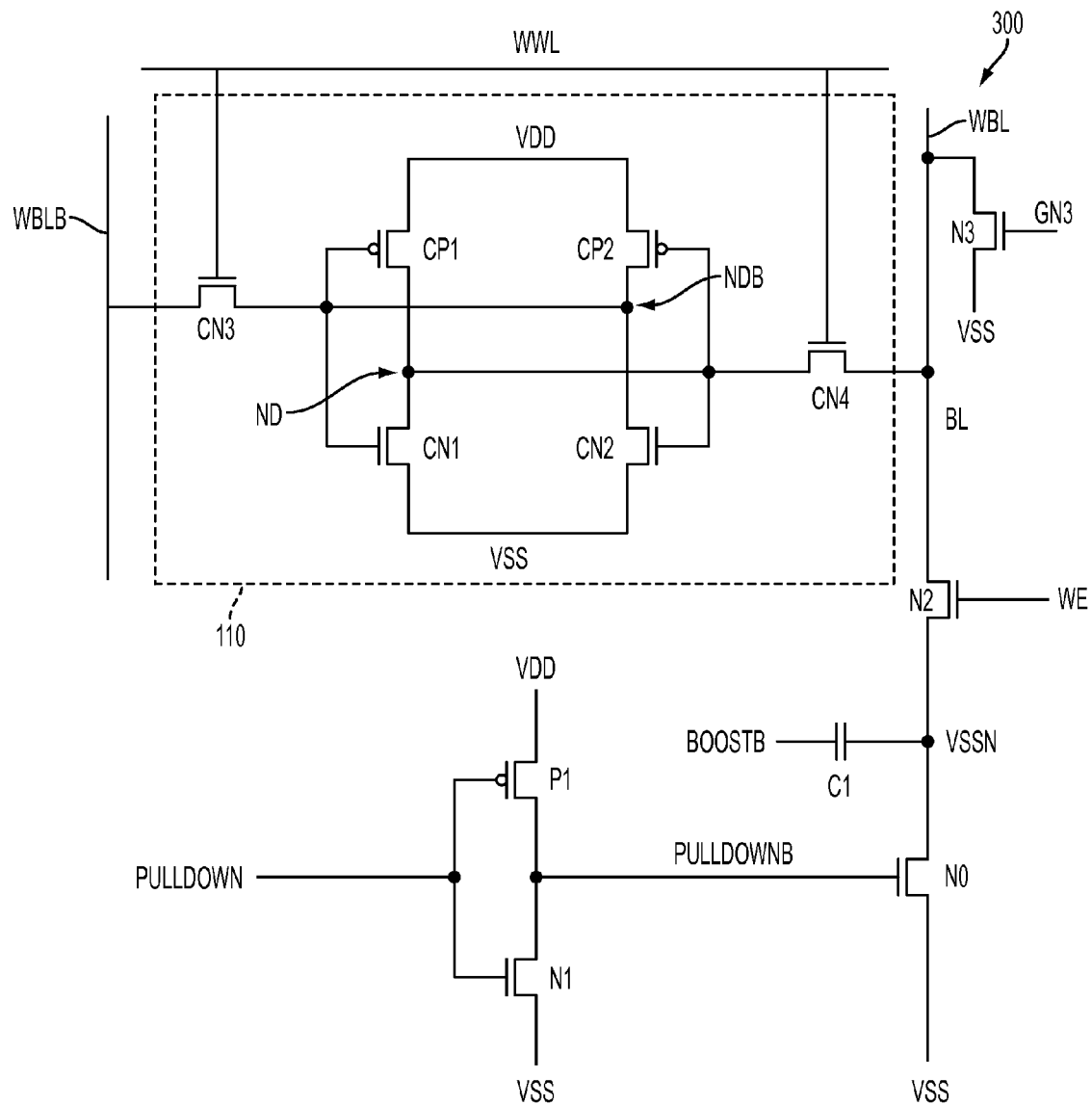
FIG. 3 is a diagram of another circuit that generates a negative voltage value on the write bit line, in accordance with some embodiments.

FIG. 3 is a diagram of a circuit 300, in accordance with some embodiments. Compared with circuit 100, circuit 300 includes an additional transistor N3 coupled to write bit line WBL. For illustration, voltage VG_N3, VD_N3, and VS_N3 are voltages at the gate, the drain, and the source of transistor N3, respectively, and Vth_N3 is the threshold voltage of transistor N3. In some embodiments illustrated in FIG. 3, the source of transistor N3 is coupled to reference supply voltage VSS.

In some embodiments, transistor N3 and transistor N0 are used to clamp node N.VSSN. Transistor N0 used to clamp node N.VSSN was explained above with reference to FIG. 1. Transistor N3 used to claim node N.VSSN will be explained below.

In some embodiments, transistors N0, P1, and N1 are not used. In such embodiments, transistor N3 is used to clamp node N.VSSN. When node N.VSSN and thus write bit line WBL are negatively boosted, node N.VSSN and write bit line WBL are clamped at VS_N3–Vth_N3 or VSS–Vth_N3 in a same manner as transistor N0 clamping node N.VSSN at VSS–Vth_N0 as explained above. Further, in some embodiments, by operations of capacitor C1 and transistor N3, the following conditions are met:

$$VS\_N3 > Vtarget \text{ and}$$

$$VG\_N3 >= Vtarget + Vth\_N3$$

In some embodiments, circuit 300 does not include transistor N2, and write bit line WBL is directly coupled to node N.VSSN.

Figure 4:
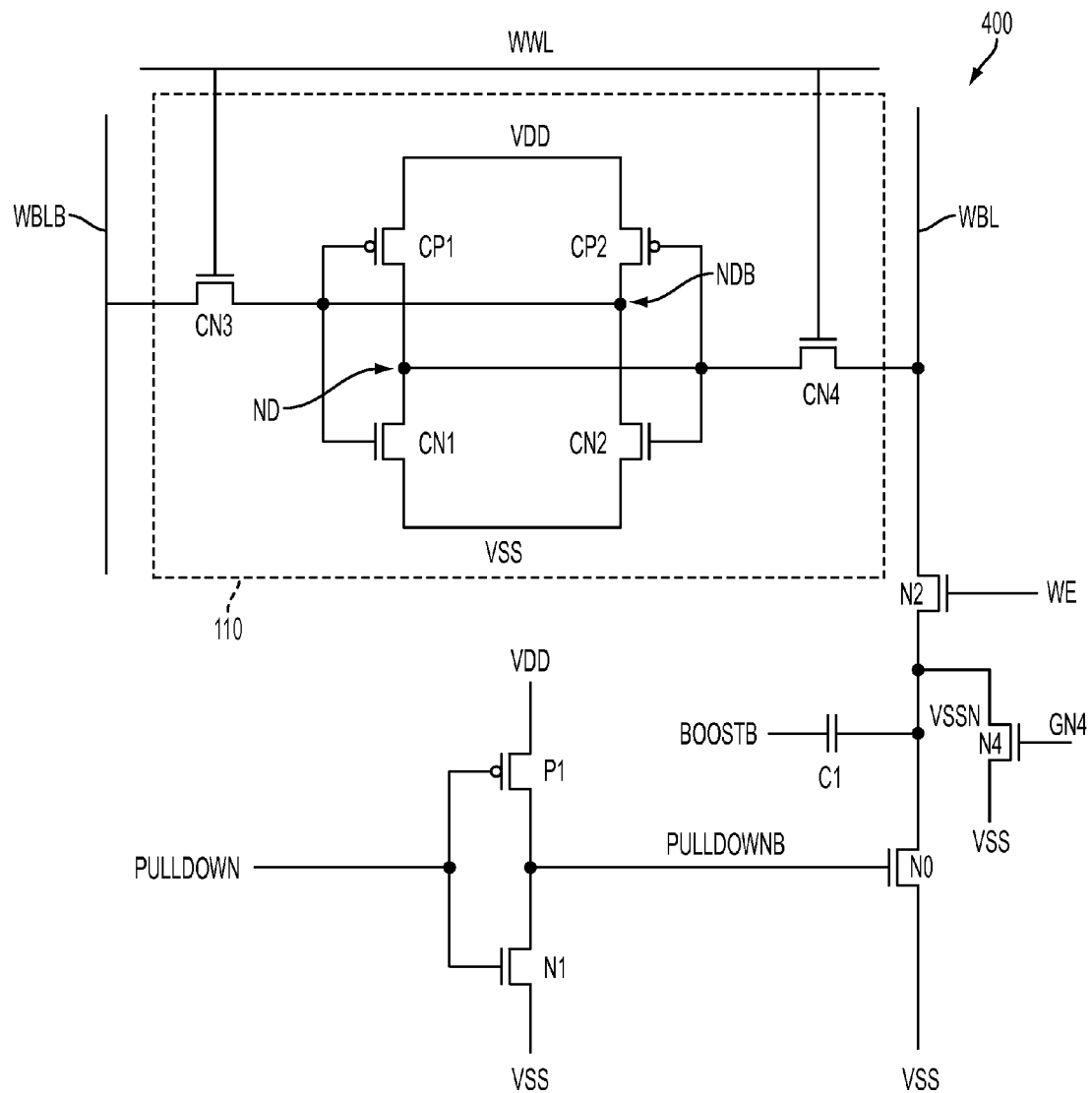
FIG. 4 is a diagram of another circuit that generates a negative voltage value on the write bit line, in accordance with some embodiments.

FIG. 4 is a diagram of a circuit 400, in accordance with some embodiments. Compared with circuit 100, circuit 400 includes an additional transistor N4 having a drain coupled to node N.VSSN. For illustration, voltage VG_N4, VD_N4, and VS_N4 are voltages at the gate, the drain, and the source of transistor N4, respectively, and Vth_N4 is the threshold voltage of transistor N4. In the illustrated embodiments of FIG. 4, the source of transistor N4 is coupled to reference supply voltage VSS.

In some embodiments, transistor N4 and transistor N0 are used to clamp node N.VSSN. Transistor N0 used to clamp node N.VSSN was explained above with reference to FIG. 1. Transistor N4 used to claim node N.VSSN will be explained below without transistor N0. In some embodiments, when node N.VSSN and write bit line WBL are negatively boosted, node N.VSSN and write bit line WBL are clamped at VS–N4–Vth_N4 or VSS–Vth_N4 in a same manner as transistor N0 clamping node N.VSSN at VSS–Vth_N0 as explained above. Further, in some embodiments, by operation of capacitor C1 and transistor N4, the following conditions are met:

$$VS\_N4 > Vtarget \text{ and}$$

$$VG\_N4 >= Vtarget + Vth\_N4$$

In some embodiments, circuit 400 also includes transistor N3 coupled to write bit line WBL as illustrated in FIG. 3. In such embodiments, transistors N0, N3, and N4 are used to clamp node N.VSSN.

In some embodiments circuit 400 does not include transistor N2, and write bit line WBL is directly coupled with node N.VSSN.

In the above illustration, write bit line WBL is used for illustration. Clamping write bit line WBLB is within the contemplated scope of the disclosure and is done in a manner similar to clamping write bit line WBL.

In some embodiments, a circuit comprises a first transistor, a capacitive component, a second transistor, and a data line. The first transistor has a threshold voltage value, a first terminal, a second terminal, and a third terminal. The capacitive component has a first capacitive terminal and a second capacitive terminal. The second transistor has a first terminal, a second terminal, and a third terminal. The first terminal of the first transistor is coupled with the first terminal of the capacitive component and a second terminal of the second transistor. The second terminal of the first transistor is configured to receive a second-terminal voltage value. The third terminal of the first transistor is configured to receive a third-terminal voltage value. The first terminal of the second transistor is coupled with the data line. The third terminal of the second transistor is configured to receive a second-transistor control signal. The first transistor is configured to be on and off to maintain the data line at a data line voltage value.

In some embodiments, a circuit comprises a data line, a first transistor, and a capacitive device. The first transistor has a threshold voltage value, a first terminal, a second terminal, and a third terminal. The capacitive device has a first capacitive terminal and a second capacitive terminal. The first terminal of the first transistor is coupled with the data line and a first terminal of the capacitive device. The second terminal of the first transistor is configured to receive a second-terminal voltage value. The third terminal of the first transistor is configured to receive a third-terminal voltage value. The data line is configured to be clamped at a voltage value based on the threshold voltage value, the second-terminal voltage value, the third terminal voltage value, and a voltage value at the second capacitive terminal.

In a method of some embodiments, a first terminal of a capacitive component is coupled to a node and a first terminal of a first transistor. A first logical value is applied to a second terminal of the capacitive component. The second terminal of the capacitive component is caused to transition from the first logical value to a second logical value different from the first logical value. A second terminal of the first transistor receives a second-terminal voltage value. A third terminal of the first transistor receives a third-terminal voltage value. A threshold voltage value of the first transistor, the second-terminal voltage value and the third-terminal voltage value cause the first transistor to be on and off such that the node is substantially at a node voltage value.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

Various figures show capacitor C1 for illustration. Equivalent circuitry may be used. For example, a capacitive component, device, circuitry or network (e.g., a combination of capacitors, capacitive devices, circuitry, etc.) can be used in place of capacitor C1.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
a first transistor having a threshold voltage value, a first terminal, a second terminal, and a third terminal;
a capacitive component having a first capacitive terminal and a second capacitive terminal;
a second transistor having a first terminal, a second terminal, and a third terminal; and
a data line,
wherein
the first terminal of the first transistor is coupled with the first capacitive terminal of the capacitive component and the second terminal of the second transistor;
the second terminal of the first transistor is configured to receive a second-terminal voltage value;
the third terminal of the first transistor is configured to receive a third-terminal voltage value;
the first terminal of the second transistor is coupled with the data line;
the third terminal of the second transistor is configured to receive a second-transistor control signal; and
the first transistor is configured to be on and off to maintain the data line at a data line voltage value.

2. The circuit of claim 1, wherein
the second transistor is configured to be on based on the second-transistor control signal;
the data line is maintained at the data line voltage value based on the threshold voltage value of the first transistor, the second-terminal voltage value of the first transistor, a third terminal voltage value of the first transistor, and a voltage value at the second capacitive terminal.

3. The circuit of claim 1, comprising:
an inverter having an output node,
wherein
the output node of the inverter is coupled with the third terminal of the first transistor; and
the inverter is configured to provide a logical value having a same value as the second-terminal voltage value.

4. The circuit of claim 1, comprising:
a third transistor having a first terminal, a second terminal, and a third terminal; and
a fourth transistor having a first terminal, a second terminal, and a third terminal,
wherein
the first transistor, the second transistor, and the third transistor are each of N-type;
the fourth transistor is of P-type;
the first terminal of the third transistor and the first terminal of the fourth transistor are coupled together and to the third terminal of the first transistor;
the second terminal of the third transistor is coupled with the second terminal of the first transistor; and
the third terminal of the third transistor is coupled with the third terminal of the fourth transistor.

5. The circuit of claim 1, comprising at least one of:
a third transistor having a first terminal, a second terminal, and a third transistor; or
a fourth transistor having a first terminal, a second terminal, and a third transistor,
wherein
the first terminal of the third transistor is coupled to the data line;
the second terminal of the third transistor is configured to receive a second-terminal voltage value of the third transistor;
the third terminal of the third transistor is configured to receive a third-terminal voltage value of the third transistor;
the first terminal of the fourth transistor is coupled to the first capacitive terminal;
the second terminal of the fourth transistor is configured to receive a second-terminal voltage value of the fourth transistor; and
the third terminal of the fourth transistor is configured to receive a third-terminal voltage value of the fourth transistor.

6. The circuit of claim 1, comprising
a memory cell, wherein the data line carries data to be written to the memory cell.

7. The circuit of claim 1, wherein
the capacitive component is configured to cause a voltage value at the first capacitive terminal to be lower than the second-terminal voltage value of the first transistor.

8. A circuit comprising:
a data line;
a first transistor having a threshold voltage value, a first terminal, a second terminal, and a third terminal; and
a capacitive device having a first capacitive terminal and a second capacitive terminal,
wherein
the first terminal of the first transistor is coupled with the data line and the first capacitive terminal of the capacitive device;
the second terminal of the first transistor is configured to receive a second-terminal voltage value;
the third terminal of the first transistor is configured to receive a third-terminal voltage value, and corresponds to a gate terminal;
the second capacitive terminal of the capacitive device is configured to receive a capacitive voltage value independent of the third-terminal voltage value;
the second-terminal voltage value is independent of the third-terminal voltage value; and
the data line is configured to be clamped at a voltage value based on the threshold voltage value, the second-terminal voltage value, the third-terminal voltage value, and a voltage value at the second capacitive terminal.

9. The circuit of claim 8, comprising
an inverter having an output,
wherein
the output of the inverter is coupled with the third terminal of the first transistor; and
the inverter is configured to provide a logical value having a same value as the second-terminal voltage value.

10. The circuit of claim 8, comprising:
a second transistor having a first terminal, a second terminal, and a third terminal; and
a third transistor having a first terminal, a second terminal, and a third terminal,
wherein
the first transistor and the second transistor are each of N-type;
the third transistor is of P-type;
the first terminal of the second transistor and the first terminal of the third transistor are coupled together and to the third terminal of the first transistor;
the second terminal of the second transistor is coupled with the second terminal of the first transistor; and the third terminal of the second transistor is coupled with the third terminal of the third transistor.

11. The circuit of claim 8, wherein
the capacitive device is configured to cause a voltage value at the first capacitive terminal to be lower than the second-terminal voltage value.

12. A method based on a node, comprising:
applying a first logical value to a second terminal of a capacitive component; and
causing the second terminal of the capacitive component to transition from the first logical value to a second logical value different from the first logical value,
wherein
   a first terminal of the capacitive component is coupled to the node and a first terminal of a first transistor;
   a second terminal of the first transistor receives a second-terminal voltage value;
   a third terminal of the first transistor receives a third-terminal voltage value; and
   a threshold voltage value of the first transistor, the second-terminal voltage value, and the third-terminal voltage value cause the first transistor to be on and off such that the node is substantially at a node voltage value.

13. The method of claim 12, comprising:
writing to a memory cell based on the node voltage value.

14. The method of claim 12, comprising:
causing the third-terminal voltage value to have the second logical value,
wherein
a voltage value of the second logical value is substantially the same as the second-terminal voltage value.

15. The method of claim 12, comprising:
causing the third terminal of the first transistor to have the third-terminal voltage value by an inverter.

16. The method of claim 15, wherein
the inverter receives a supply voltage value substantially the same as the second-terminal voltage value.

17. The method of claim 12, wherein
the node voltage value is electrically transmitted through a switching device to a data line.

18. The method of claim 17, wherein
the data line is coupled with a first terminal of a second transistor;
a second terminal of the second transistor receives a second-terminal voltage value of the second transistor; and
a third terminal of the second transistor receives a third-terminal voltage value of the second transistor.

19. The method of claim 12, wherein
the node is coupled with a first terminal of a second transistor;
a second terminal of the second transistor receives a second-terminal voltage value of the second transistor; and
a third terminal of the second transistor receives a third-terminal voltage value of the second transistor.

20. The method of claim 12, wherein
the first logical value is a high logical value; and
the second logical value is a low logical value.

\* \* \* \* \*